United States Patent [19]

Ohlenbusch

[11] Patent Number: 4,986,729
[45] Date of Patent: Jan. 22, 1991

[54] WAFER TRANSFER APPARATUS

[75] Inventor: Cord W. Ohlenbusch, Andover, Mass.

[73] Assignee: Proconics International, Inc., Wilmington, Mass.

[21] Appl. No.: 471,708

[22] Filed: Jan. 29, 1990

Related U.S. Application Data

[63] Continuation of Ser. No. 342,667, Apr. 24, 1989, abandoned, which is a continuation of Ser. No. 102,105, Sep. 29, 1987, abandoned.

[51] Int. Cl.⁵ ............................................. B65G 65/02
[52] U.S. Cl. .................................. 414/787; 414/404; 414/416; 414/730; 414/732; 414/737
[58] Field of Search ............... 414/403, 404, 787, 730, 414/732, 737, 416; 250/223, 491.1

[56] References Cited

U.S. PATENT DOCUMENTS

| | | | |
|---|---|---|---|
| 3,902,615 | 9/1975 | Levy et al. | 414/416 X |
| 4,493,606 | 1/1985 | Foulke et al. | 414/787 |
| 4,603,897 | 8/1986 | Foulke et al. | 294/64.1 |
| 4,699,556 | 10/1987 | Foulke | 414/404 |
| 4,708,582 | 11/1987 | Hamada et al. | 414/416 X |

FOREIGN PATENT DOCUMENTS 252535 12/1985 Japan ................................. 414/416

*Primary Examiner*—David A. Bucci
*Attorney, Agent, or Firm*—Fish & Richardson

[57] ABSTRACT

Apparatus for placing a first element at a location on a second element, there being associated with the location some known variation in the shape of the second element, the apparatus including a support member for supporting the first element while the member is translated toward the second element along a placement direction, a transporter for moving the support member or the second element along a transport direction transverse to the placement direction, a sensor for sensing the relative alignment of the support member with the known variation in shape along the transport direction, the sensor including a scanning element that is detachably engageable by the support member, and a holder for storing the scanning element when the scanning element is not in use.

20 Claims, 3 Drawing Sheets

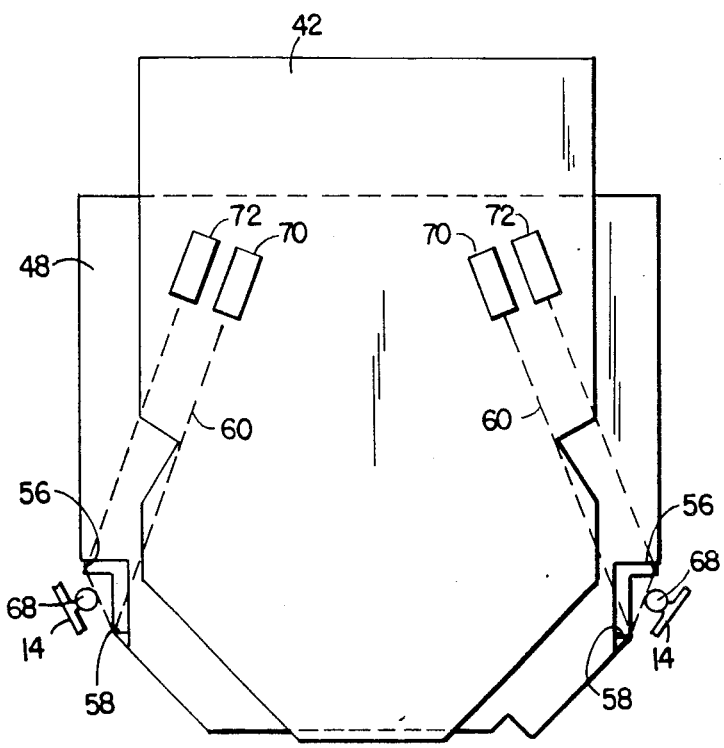
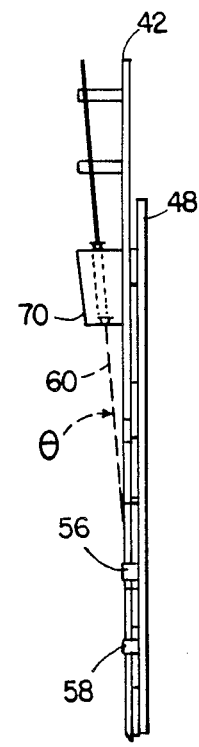
FIG. 5  FIG. 6
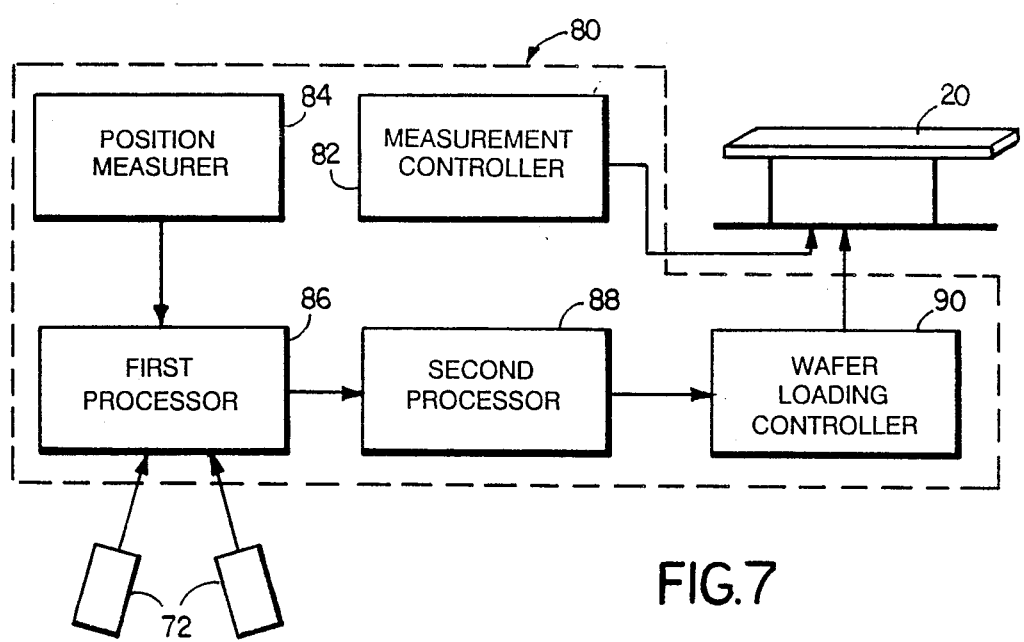
FIG. 7

WAFER TRANSFER APPARATUS

This application is a continuation of application Ser. No. 07/342,667, filed Apr. 24, 1989, now abandoned, which is a continuation of application Ser. No. 07/102,105, filed Sept. 29, 1987, now abandoned.

BACKGROUND OF THE INVENTION

The invention relates to improvements in apparatus for automatic, precise placement of objects, e.g., semiconductor wafers.

It is desirable to rapidly and automatically transfer semiconductor wafers from plastic storage boats to quartz boats (in which they are introduced into a diffusion furnace), and vice versa, without introducing particulate contamination (caused, for example, by scraping of wafers against the quartz boat during placement) onto the surfaces of the wafers. The quartz boats each include two upper, horizontal, rails that are spaced from each other. The two rails contain pairs of vertical slots used to retain the wafers. Scraping of a wafer can occur if the wafer is not properly aligned with the vertical slots during placement of the wafer into the quartz boat.

In a known system that is generally described in U.S. Pat. No. 4,493,606, a support member (or "paddle") transfers the wafers, one by one, from the plastic boat to the quartz boat. The paddle includes a center portion with vacuum openings and two outer, downwardly directed arms, which fit outside of upper rails of the quartz boat. The paddle includes a scanning system for identifying the locations of the quartz boat slots with respect to the paddle so that the wafer can be accurately aligned with a respective pair of slots during placement. A light source in each arm emits a beam of light that passes through a quartz boat slot (assuming that it is aligned therewith) is reflected by a respective mirror on the center portion of the paddle, and returns through the same slot to a sensing element located on the same arm. If the beam is not aligned with a slot, it is blocked by the rail. Prior to transfer of wafers, the unloaded quartz boat is moved past the paddle, and the positions of the slots are scanned and noted.

Certain quartz boats have rails configured such as not to permit light beams originating outside optic arms to pass through the slots.

SUMMARY OF THE INVENTION

It has been discovered that the relative alignment of a support member for carrying a first element (e.g., a paddle used to carry a semiconductor wafer) and a known location at a second element (e.g, a slot of a quartz boat) could be determined using a scanning element that is engaged by the support member while sensing a variation in shape of the second element (e.g., a slot), and is placed in a holder when it is not. Such a system thus has the advantage of very accurate alignment, permitted by having a scanning element carried by a paddle, and additionally permits the scanning element to be detached from the paddle during actual transfer, which has advantage, e.g., if the scanning element is in a position that would cause interference with other members during transfer. It also facilitates scanning of otherwise hard-to-scan structures.

In preferred embodiments sensing is accomplished by transmitting an energy beam (e.g., light) along a path intersecting the variation in shape; an energy beam source and detector are carried by the support member, and two reflectors (used to direct the energy beam to the variation in shape) are carried by the scanning element, which is a scanning plate; the scanning plate holder is carried on a trolley used to support a quartz boat for semiconductor wafers; sensing is done in advance of placement; the output of the sensor is processed to determine the locations at which the wafer paddle is so aligned that wafers supported thereon would be received at the centers of the slots; and there are two sources, two detectors, and two sets of two reflectors to sense slots in each of two rails in the boat.

Other advantages and features of the invention will be apparent from the following description of the preferred embodiment thereof and from the claims.

DESCRIPTION OF THE PREFERRED EMBODIMENT

The preferred embodiment will now be described.

Drawings

FIG. 5 is a diagrammatic elevation showing the scanning element mounted on a wafer transfer paddle of the FIG. 1 apparatus.

FIG. 6 is a side elevation of the paddle and attached scanning plate.

STRUCTURE

Figure 1:
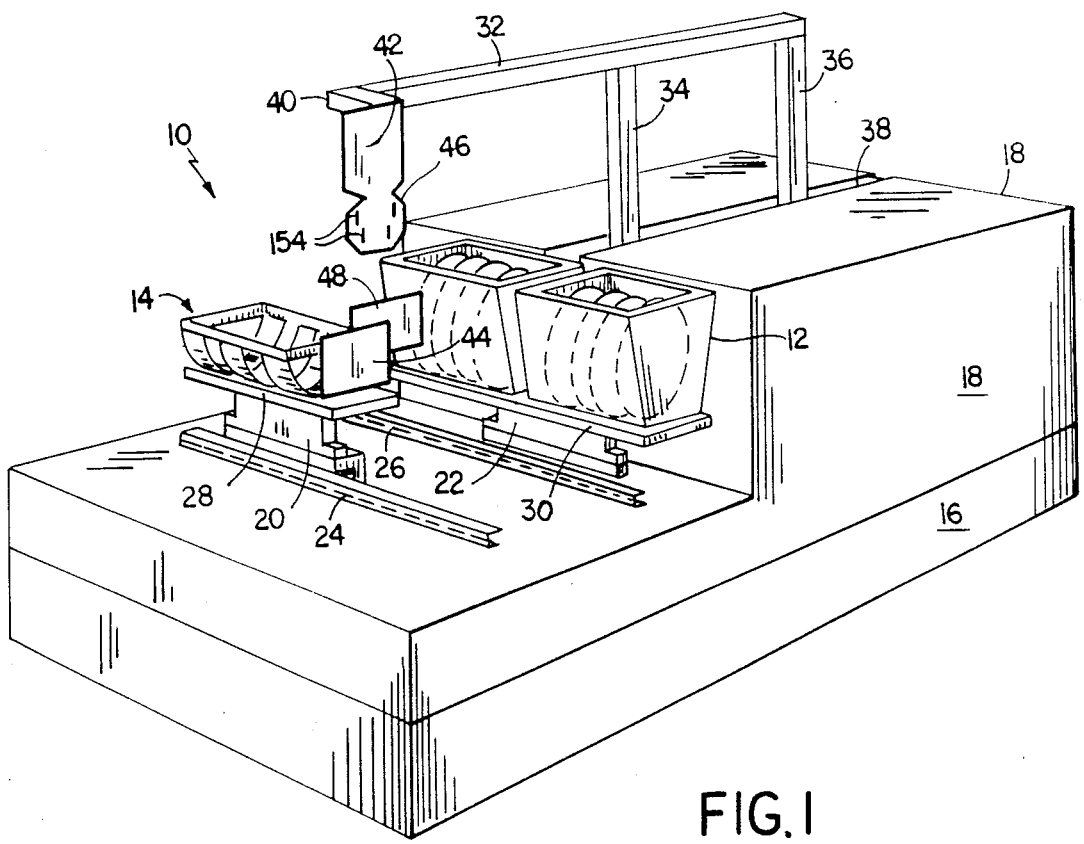
FIG. 1 is a diagrammatic perspective view of wafer transfer apparatus according to the invention.

Referring to FIG. 1, there is shown wafer apparatus 10, for transferring semiconductor wafers 11 to and from plastic boats 12 to quartz boats 14 (in which the wafers are held when put into a diffusion furnace).

Apparatus 10 has base 16 (upon which cover 18 rests), trolleys 20, 22 for transporting the boats, and wafer transfer arm 32.

Trolleys 20, 22 extend through slots 24, 26 respectively, of cover 18. Trolley 20 has affixed to its upper end platform 28, which supports quartz boat 14 and scanning plate holder 44, which supports aluminum, scanning plate 48. Trolley 22 has platform 30 affixed to its upper end to support plastic boats 12. Trolleys 20, 22 have support drive mechanisms permitting precise movement of boats 12, 14 along transport directions parallel to slots 24, 26.

Wafer transfer arm 32 is attached to vertical arms 34, 36, which extend through slot 38 in cover 18 and are driven and controlled by systems described in detail in U.S. Pat. Nos. 4,493,606 and 4,603,897, which are hereby incorporated by reference, to move paddle 42 back and forth between boats 12, 14. A right angle member 40 connects arm 32 to aluminum wafer paddle 42, which has four suction openings 154 for gripping wafers. At each vacuum opening 154, there is a picture frame like raised ridge (0.010 elevation) surrounding the opening. The openings and ridges are located so as to grip wafers nearer their edges than their centers.

Figure 2:
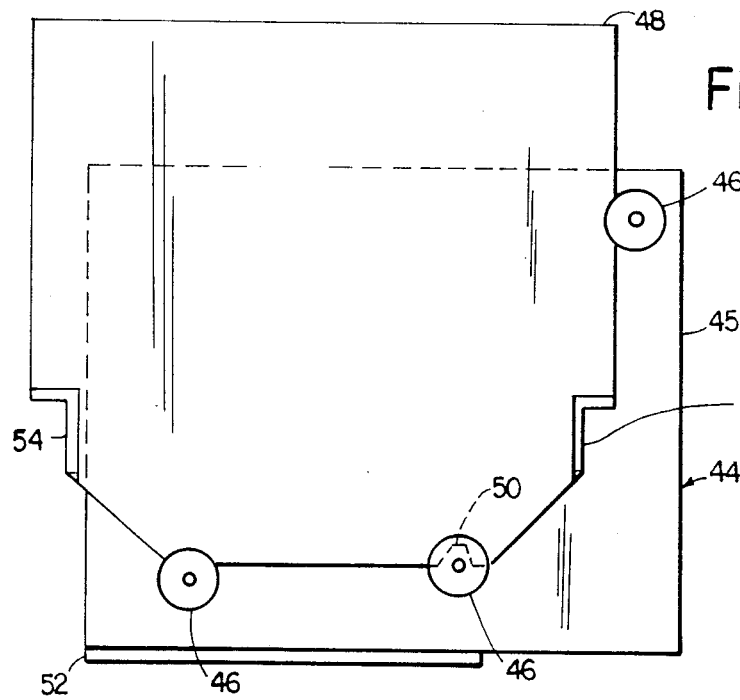
FIG. 2 is an elevation showing a scanning element and a holder of the FIG. 1 apparatus.

Referring to FIG. 2, holder 44 includes vertical support plate 45 and three posts 46 (FIG. 4), which extend outward from support plate 45 to support scanning plate 48. Scanning plate 48 contains notch 50, into which one of the posts 46 fits, thereby insuring that the scanning plate 48 rests securely at a known location on supporting plate 45. Notch 50 is 0.177" deep, makes 45° angles with the horizontal, and has 0.06" maximum radius at the top. The front surface of scanning plate 48 is Teflon-coated. Support plate 45 is secured to platform 28 by means of mounting plate 52. Mirror mounts 54 are mounted on scanning plate 48.

Figure 3A:
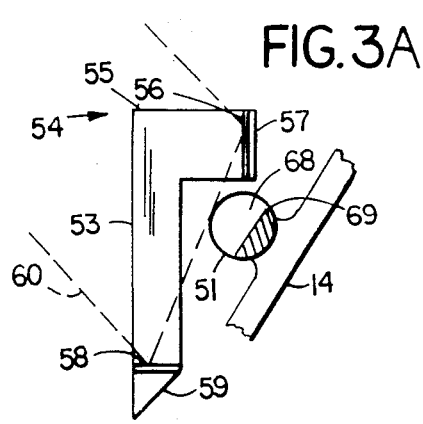
FIGS. 3A–3C are top, side, and front views of a mirror mounting bracket of the FIG. 2 scanning plate.
Figure 3B:
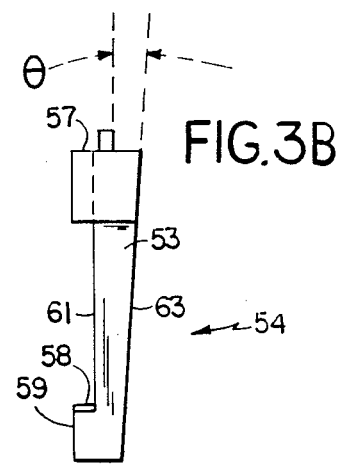
Figure 3C:
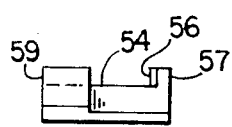

Referring to FIGS. 3A, 3B, and 3C, each mirror mount 54 is in the general form of a right angle to permit a portion of quartz boat rail 51 to be located in the region between legs 53, 55 of the right angle. Mirrors 56 and 58 are mounted on perpendicular vertical surfaces of members 57, 59 extending outward from legs 53, 55 to reflect a light beam along a path 60, which either passes through the location of a slot 68 of quartz boat rail 51 or is blocked by a solid wall portion 69, depending upon the relative position of paddle 42 and rail 51 along the longitudinal axis of rail 51. In FIG. 3B, a 4-degree angle $\theta$ is shown between the slopes of the top and bottom surfaces 61, 63 of mirror mount 54. The need for this 4-degree angle $\theta$ is explained below.

Figure 4:
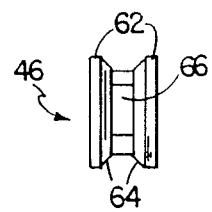
FIG. 4 is a side elevation of a mounting post of the FIG. 2 holder.

Referring to FIG. 4, each post 46 (Delrin plastic) consists of outer portions 62 (0.562" diameter, 0.125" wide) and central portion 66 (0.250" diameter, 0.094" wide). Outer portions 62 include inwardly directed tapered portions 64 (0.06" wide, 45°) to direct scanning plate 48 to the region between outer portions 62 without risk of damage to the scanning plate 48.

Referring to FIGS. 1, 5, and 6, paddle 42 uses suction at vacuum engagement openings 154 (FIG. 1) to pick up scanning plate 48, shown behind paddle 42 in FIG. 5. Light sources 70 and detectors 72 are mounted on the surface of paddle 42 that is opposite the vacuum openings. Light sources 70 emit light beams along paths 60; the beams reflect off of mirrors 58, and pass through the region occupied by either slots 68 or walls 69, as described above; assuming that the beams are aligned with slots 68, they pass to mirrors 56, and are reflected back to light detectors 72, which detect the light beams 60. As shown in FIG. 6, light beam 60 approaches mirrors 58 and 56 at an angle $\theta$ of 4 degrees. Hence the need for the above-mentioned 4-degree angle between the bottom and top surfaces 61, 63 of mirror mounts 54.

OPERATION

Referring to FIG. 7, control system 80 consists of measurement controller 82, position measurer 84, first processor 86, second processor 88, and wafer loading controller 90. Control system 80 controls the movement of trolley 20 during scanning of quartz boat 14 and during wafer transfer, as described below.

Referring to FIG. 2, in preparation for scanning of quartz boat 14 and wafer transfer between boats, scanning plate 48 is manually placed on scanning plate holder 44, with its Teflon face facing away from scanning plate holder 44. Notch 50 rests on one post 46, and the other posts 46 support the bottom side and one vertical side of scanning plate 48. It should be possible to rock scan plate 48 by a small amount. Scanning plate 48 does not touch central portion 66 of the top most post 46. Before scanning, the alignment of scanning plate 48 is checked by manually placing the quartz boat stage next to paddle 42, so that scanning plate 48 and paddle 42 directly face each other. Paddle 42 and scanning plate 48 should be exactly parallel to each other. If the paddle and the scanning plate are not exactly parallel, the bottom-most post 46 can be raised or lowered to make adjustments.

Referring to FIG. 1, two plastic boats 12, filled with wafers 11, are washed and then secured to platform 30, of trolley 22.

Scanning of quartz boat 14 begins with paddle 42 being moved to the position shown in FIG. 1 and then downward to the location of scanning plate holder 44, so that paddle 42 faces scanning plate 48. The external vacuum source providing suction at openings 154 is activated, and trolley 20 advances toward paddle 42 until openings 154 are closed by contact between scanning plate 48 and paddle 42, at which time the movement of trolley 20 ceases.

Paddle 42, with scanning plate 48 held to it by the suction provided at openings 154, is then raised. Trolley 20 then advances quartz boat 14 so that its far end is directly under the location of scanning plate 48. Paddle 42, together with scanning plate 48, is then lowered into the quartz boat along a displacement direction.

Referring to FIG. 5 and FIG. 7, each light source 70 on paddle 42 emits a light beam along path 60, which light beam reflects off of mirror 58 on scanning plate 48, passes through the location of quartz boat rail 51, reflects off of mirror 56, and returns to light detector 72, which detects the light beams.

Measurement controller 82 activates trolley 20 to advance quartz boat 14 steadily until scanning plate 48 reaches the near end of the quartz boat. During travel light is transmitted through slots 68 and blocked by wall portions 69. Position measurer 84 measures the position of trolley 20 as trolley 20 advances. First processor 86 stores data corresponding to information received by light sensors 72 and position measurer 84 as the scanning systems scans quartz boat 14. This precise information of actual slot location relative to paddle 42 is processed by second processor 88 to determine the locations of trolley 20 at which paddle 42 and slots 68 are so aligned that wafers 11 can be received by slots 62.

Referring to FIG. 1 and FIG. 7, after scanning of quartz boat 14 is complete, paddle 42, with scanning plate 48 held to it by the suction provided at openings 154, is raised to the position of FIG. 1. Trolley 20 then advances until scanning plate holder 44 is directly under the location of scanning plate 48. Paddle 42, together with plate 48, is then lowered, so that scanning plate 48 rests securely on posts 46.

Wafer transfer begins with paddle 42 being moved into the first of the two plastic boats so that the face of paddle 42 with the vacuum openings faces a wafer. The external vacuum source providing suction at openings 154 is activated, and trolley 22 is advanced until the wafer has been engaged, at which time the trolley comes to a full stop.

Paddle 42, with the first wafer held to it by the suction provided at openings 154, is then raised, is translated over the quartz boat, which has been located by water loading controller 90 at the precise location along the transport direction for receiving the first wafer, and is lowered along the placement direction into quartz boat 14. The precise location of the slot 68 in quartz boat 14 for receiving the wafer is determined by second processor 88 in accordance with the scanning data stored by first processor.

A soft placement mechanism is used to provide a soft final placement of the wafer in the quartz boat. The vacuum source for suction of vacuum openings 154 is turned off; the quartz boat is then translated slightly to move the wafer away from the paddle, and the paddle is raised from the quartz boat and returned to the plastic boat.

The same general wafer transfer procedure is repeated for the remaining wafers. Transfer from the quartz boat to the plastic boat is accomplished in the reverse manner, using soft pickup instead of soft placement. Once again, wafer loading controller 90 activates trolley 20 to locate quartz boat 14 in the precise location for pickup of each wafer, as determined in accordance with the scanning data stored by first processor 86 and processed by second processor 88 to determine the locations of trolley 20 at which paddle 42 and slots 68 are so aligned that wafers 11 can be received by paddle 42. Other embodiments of the invention are within the scope of the claims.

What is claimed is:

1. Apparatus for placing a first element at a precise location on a second element, there being associated with said precise location some known variation in the shape of said second element, said apparatus comprising
   a support member means for supporting said first element and for translating said first element toward said second element along a placement direction,
   transport means for changing the relative displacement between said support member and said second element along a transport direction transverse to said placement direction,
   sensing means for sensing the relative alignment of said support member with said known variation in shape along said transport direction,
   said sensing means including a scanning element that is detachably engageable by said support member, and
   a holder for storing said scanning element when said scanning element is not in use, said holder being located at a position at which said support member can transfer said scanning element to and receive said scanning element from said support member.

2. The apparatus of claim 1 wherein said sensing means comprises an energy beam that is directed along a path that interacts with said variation in shape so that the transmittance of said beam along with path varies with changes in relative alignment of said support member and said second element.

3. The apparatus of claim 2 wherein said sensing means comprises an energy-beam source that is mounted on said support member and is adapted and positioned to direct said energy beam along said path.

4. The apparatus of claim 3 wherein said sensing means comprises an energy beam detector that is mounted on said support member and is adapted and positioned to detect the amount of said beam transmitted along said path.

5. The apparatus of claim 4 wherein said scanning element comprises a reflector adapted and positioned, when engaged by said support member, to reflect said energy beam along said path from said source to said detector so that said energy beam interacts with said variation in shape.

6. The apparatus of claim 5 wherein there are two said reflectors on said scanning element positioned so that one reflector reflects said beam from said source to the other reflector, which in turn reflects it to the detector, said beam interacting with said variation in shape between said reflectors.

7. The apparatus of claim 6 wherein said support member is a vacuum engagement paddle having vacuum openings on a first paddle surface for engaging semiconductor wafers, said source and detector are carried on an opposite second paddle surface, and said scanning plate has a first scanning plate surface that is engageable by said vacuum openings.

8. The apparatus of claim 7 wherein said scanning plate is wider than said paddle, and said reflectors are transverse to and extend outward from said first scanning plate surface beyond said second paddle surface when said element is engaged by said paddle, said path is spaced from said second paddle surface.

9. The apparatus of claim 8 further comprising a boat for receiving wafers from said paddle, said boat having an inner dimension that is less than the width of said scanning plate.

10. The apparatus of claim 5 wherein there are a plurality of said variations in shape on said second element along said transport direction, and said transport means is adapted to move said support member or said second element so as to cause said sensing means to successively move past each of said plurality of variations in shape.

11. The apparatus of claim 10 further comprising first processing means for storing information on the relative alignment of said support member and variations in shape as said transport means moves said sensing means past said variations, and
    second processing means for processing said stored alignment information and determining therefrom the positions required of said first transport means in order for said support member when moving along said placement direction to place a said first element at each of said plurality of variations of shape.

12. The apparatus of claim 1 wherein said first element is a semiconductor wafer, said support member is adapted to support said wafer, said variation in shape comprises a receptacle for said wafer at said precise location on said second element, and said sensing means includes at least one source for producing an energy beam and at least one detector for detecting said energy beam.

13. The apparatus of claim 12 wherein said second element is a boat for a plurality of said wafers, said receptacles comprise wafer-supporting slots, said slots are spaced along said transport direction, and said apparatus further comprises placement means for moving said support member and sensing means with respect to said boat along said placement direction.

14. The apparatus of claim 13 wherein said placement means further comprises means for successively moving said support member back and forth along said placement direction with respect to said boat to place said wafers one at a time in said slots.

15. The apparatus of claim 13 further comprising position measuring means for measuring the position along said transport direction of said boat,
    measurement control means for activating said transport means to move said plurality of slots past said support member and said sensing means,
    first processing means for processing the outputs of said position measuring means and said sensing means to determine a plurality of alignment locations along said transport direction at which said support member and slots are so aligned that wafers moved along said placement direction by said support member would be received by said slots.

16. The apparatus of claim 15 further comprising wafer loading control means for activating said transport means to change the relative displacement between said support member and said boat so that said support member and said boat are successively aligned at each of said alignment locations and for activating said placement means at each of said locations to move a said wafer carried by said support member into a said slot.

17. The apparatus of claim 13 wherein there are two said slots in said boat for each said wafer, and wherein said sensing means comprises two energy beam sources and two energy beam detectors located on said support member, each said source direction a beam that intersects one of said slots in said pair of said slots.

18. The apparatus of claim 17 further comprising position measuring means for measuring the position along said transport direction of said boat, measurement control means for activating said transport means to move said plurality of slots past said support member and said sensing means, first processing means for processing the outputs of said position measuring means and the outputs of both said detectors of said sensing means to determine a plurality of locations along said transverse direction at which said energy beams and slots are aligned.

19. The apparatus of claim 16 wherein said transport means changes the relative displacement between said support member and said second element by moving said second element.

20. The apparatus of claim 19 wherein said transport means comprises a trolley upon which said second element rests.

* * * * *

UNITED STATES PATENT AND TRADEMARK OFFICE
CERTIFICATE OF CORRECTION

PATENT NO.  : 4,986,729
DATED       : January 22, 1991
INVENTOR(S) : Cord W. Ohlenbusch It is certified that error appears in the above-identified patent and that said Letters Patent is hereby corrected as shown below:

Col. 1, line 45, after "originating" insert --from the--.

Col. 3, line 60, "top most" should be --top-most--.

Col. 5, line 14, after "42" start a new paragraph.

Col. 6, line 1, "engaqing" should be --engaging--.

Col. 7, line 13, "direction" should be --directing--.

Signed and Sealed this

Nineteenth Day of January, 1993

Attest:

DOUGLAS B. COMER

*Attesting Officer*   Acting Commissioner of Patents and Trademarks